United States Patent [19] [11] 3,731,164
Cheney [45] May 1, 1973

[54] COMBINED BIPOLAR AND FIELD EFFECT TRANSISTORS

[75] Inventor: Glen Trenton Cheney, Allentown, Pa.

[73] Assignee: Bell Telephone Laboratories, Incorporated, Murray Hill, N.J.

[22] Filed: Sept. 17, 1971

[21] Appl. No.: 181,478

[52] U.S. Cl. ...........317/235 R, 307/304, 317/235 G, 317/235 Z

[51] Int. Cl. ...........H01l 19/00

[58] Field of Search ...........330/35, 38 M; 307/205, 251, 279, 303, 304; 317/235 G, 235 A, 235 B

[56] References Cited

UNITED STATES PATENTS 3,484,865 12/1969 Nienhuis ...........317/235
3,510,735 5/1970 Potter ...........317/235

*Primary Examiner*—Jerry D. Craig
*Attorney*—R. J. Guenther et al.

[57] ABSTRACT

In an integrated circuit of the type in which the drain region of an insulated gate field effect transistor (IGFET) also constitutes a base region of a bipolar transistor, the IGFET has interdigitated source and drain regions separated by a serpentine channel region. An emitter stripe of the bipolar transistor is included in each drain region protrusion. This configuration increases the efficiency of modulation of the bipolar emitter currents by the IGFET channel currents.

6 Claims, 6 Drawing Figures

COMBINED BIPOLAR AND FIELD EFFECT TRANSISTORS

BACKGROUND OF THE INVENTION

This invention relates to integrated circuits, and, more particularly, to integrated circuit modules comprising combined bipolar and IGFET transistors.

Field effect transistors conventionally comprise source and drain regions formed on an upper surface of a semiconductor wafer and interconnected by a channel region. A gate electrode overlying the channel region controls current flow through the channel, thereby to perform such useful functions as amplification and switching. Because current conduction is by carriers of a single polarity, field effect transistors are often known as unipolar devices to distinguish them from conventional transistors, known as bipolar devices. They are also often known by the abbreviated form FET; and, if the electrode gate is insulated from the channel layer, they are known as IGFET devices (for insulated gate field effect transistor).

An important form of integrated circuit module comprises combined bipolar and IGFET transistors in which the drain region of the IGFET also constitutes the base region of the bipolar. For example, in an N-type wafer, the bipolar transistor may be formed by an N+ emitter diffusion within a P-type base region which is also an IGFET drain region. The channel of the IGFET is that portion of the N-type wafer between the P-type base of the bipolar and an adjacent P-type source region. Integrated circuit modules of this type, sometimes known as bipolar-IGFET's, or "BIGFET's", are described, for example, in the U. S. Pat. of J. E. Price No. 3,264,493 issued Aug. 2, 1966, the U. S. Pat. of E. F. King No. 3,553,541 issued Jan. 5, 1971, and the U. S. Pat. of E. F. King No. 3,582,975 issued June 1, 1971, the latter two being assigned to Bell Telephone Laboratories, Incorporated. These references describe many advantages and uses to which such circuit modules may be put.

As with most circuit components, it would at times be desirable to operate bipolar-IGFET modules at high power and with high efficiency. There are, of course, situations in which high power is not an important consideration in circuit design; but when it is required, high efficiency is especially desirable to maximize power output while minimizing heating and other harmful effects resulting from high power dissipation.

SUMMARY OF THE INVENTION

Accordingly, it is an object of this invention to improve the efficiency of bipolar-IGFET circuit modules.

It is another object of this invention to provide a bipolar-IGFET circuit module capable of operating with relatively high power and with relatively high efficiency modulation of emitter currents.

These and other objects of the invention are attained in an illustrative embodiment thereof summarized in the Abstract of the Disclosure.

An important feature of this configuration is that current from the emitter stripe is modulated by IGFET channel current incident on both elongated sides of the emitter stripe. As will become clear later, the same structural features which increase efficiency also facilitate high power operation of the module. These and other objects, features, and advantages of the invention will be better understood from the consideration of the following detailed description of the invention taken in conjunction with the accompanying drawing.

DETAILED DESCRIPTION

Figure 1:
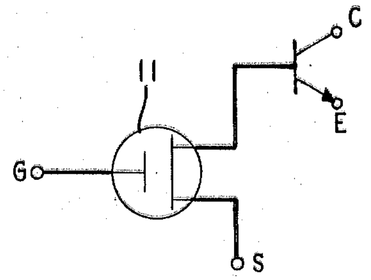
FIG. 1 PRIOR ART
FIG. 1 is a schematic circuit diagram of a circuit module of the prior art comprising combined bipolar and field effect transistors.

Referring now to FIG. 1, there is shown a prior art circuit module comprising a field effect transistor 11, the drain electrode of which is connected directly to the base electrode of a conventional bipolar transistor 12. One reason for the popularity of the module of FIG. 1 is that it can be conveniently integrated on a single semiconductor wafer, as shown in FIGS. 2 and 3, so as to have the attributes of a single electronic device.

Figure 2:
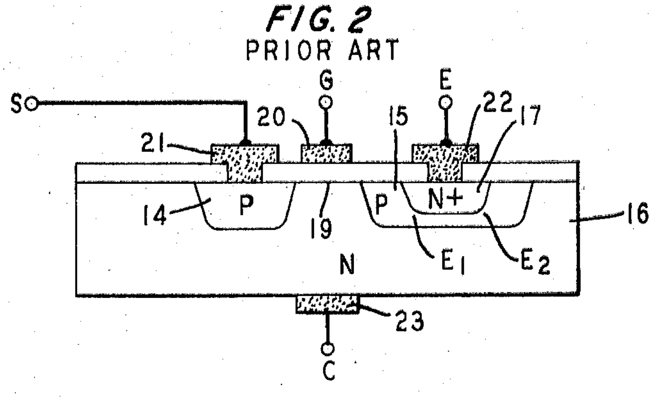
FIG. 2 PRIOR ART
FIG. 2 is a sectional schematic view of an integrated circuit implementation of the circuit module of FIG. 1.

Referring to FIG. 2, a P-type source region 14 and P-type drain region 15 are diffused into an N-type wafer 16. The drain region 15 also constitutes the base of a bipolar transistor having an emitter region 17. A channel region 19 is defined by part of the N-type wafer between source region 14 and drain region 15. A gate electrode 20 is insulated from the channel 19 by an insulating layer, and thus, the field effect transistor is an IGFET. The bulk portion of the wafer 16 constitutes a bipolar collector region to which contact is made by a collector contact 23, while contacts 21 and 22 make contact with the source and emitter regions. The gate, source, emitter, and collector terminals are respectively designated G, S, E, and C on FIG. 2 and correspond to like terminals of FIG. 1.

Figure 3:
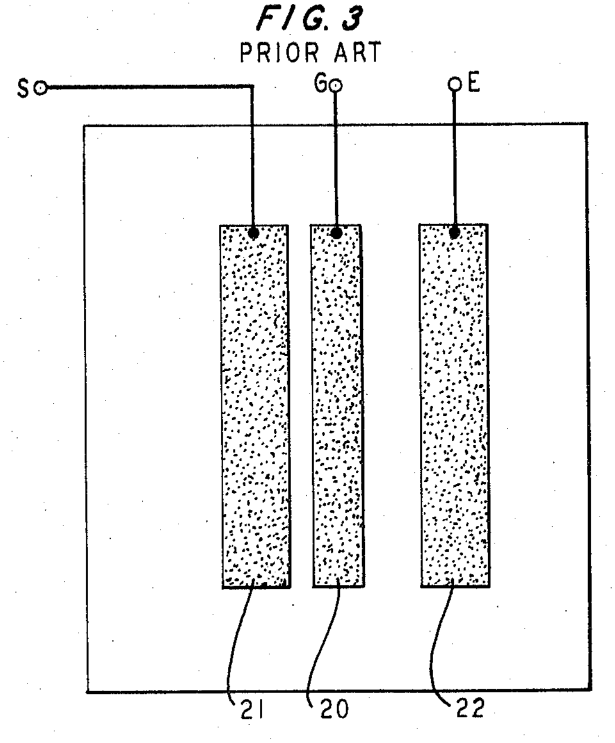
FIG. 3 PRIOR ART
FIG. 3 is a top view of the integrated circuit module of FIG. 2.

The circuit module of FIGS. 1–3 represents the simplest fundamental form of the bipolar-IGFET module, which in practice is usually modified. For example, the source and collector electrodes are frequently short-circuited, sometimes by extending source contact 21 to the collector region 16. Other devices may be integrated with the circuit module and various external connections can be made to achieve any of a number of modes of operation known in the art. In any event, it can be appreciated that one may wish to operate the module depicted at relatively high power, in which case high efficiency is usually desirable.

Referring to FIG. 3, the source, gate, and electrode regions may be made in the form of stripes, as shown; and if one wishes to operate at higher power, one would normally extend the length of the stripes. The module is, however, inherently of rather low efficiency because IGFET current from the channel 19 does not uniformly modulate emitter current transmitted from emitter region 17 through the drain-base region 15. Referring to FIG. 2, IGFET current from channel 19 tends to modulate more efficiently emitter current transmitted from emitter region edge $E_1$ than from emitter region edge $E_2$. I have found that this difference in modulation efficiency can be significant because the emitter current in such structures is inherently emitted predominantly from regions near the emitter edges; thus, the relative inefficiency of modulation of current emitted from near the edge of $E_2$ may result in a significantly reduced overall efficiency.

Figure 4:
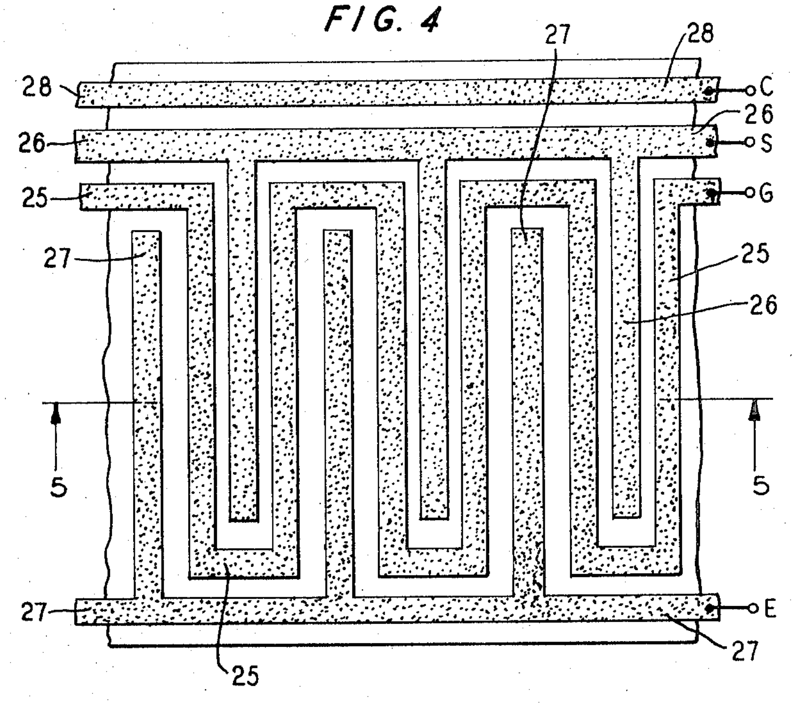
FIG. 4 is a top view of a circuit module comprising integrated bipolar and field effect transistors capable of high power and high efficiency operation in accordance with an illustrative embodiment of the invention.
Figure 5:
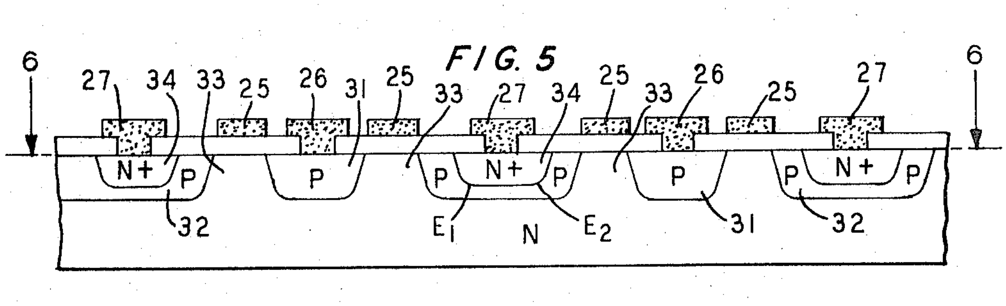
FIG. 5 is a view taken along lines 5—5 of FIG. 4.
Figure 6:
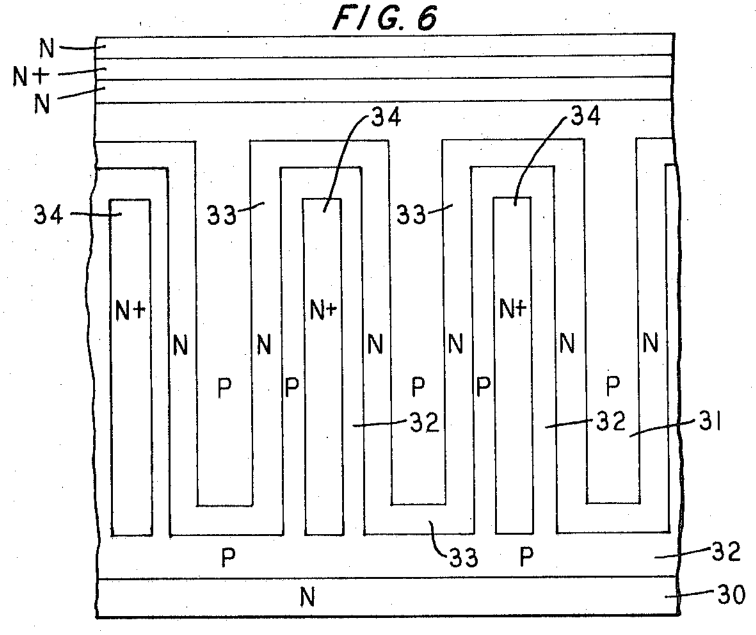
FIG. 6 is a view taken along lines 6—6 of FIG. 5.

Referring to FIGS. 4, 5, and 6, there is shown, as an illustrative embodiment of the invention, a bipolar-IGFET module capable of both high power operation and high efficiency. The device of FIGS. 4–6 operates in accordance with the same general principles, and is capable of performing the same electronic functions as that of FIGS. 1–3. Gate, source, emitter, and collector terminals G, S, E, and C correspond to similar terminals of FIGS. 1–3 and are respectively connected to gate contact 25, source contact 26, emitter contact 27, and collector contact 28 of the new bipolar-IGFET integrated circuit module. The basic structure of the device can perhaps be best understood from a consideration of FIG. 5, which is a sectional view taken along lines 5—5 of FIG. 4, and FIG. 6 which is a sectional view taken along lines 6—6 of FIG. 5.

Referring particularly now to FIG. 6, diffusions are made in N-type wafer 30 such as to form an IGFET with interdigitated P-type source and drain regions 31 and 32 separated by a serpentine N-type channel region 33. This results in an interleaving of source and drain region protrusions. N-type diffusions define an elongated emitter region 34 in each drain region protrusion.

Referring to FIG. 5, the section taken along lines 5—5 of FIG. 4 produces what appears to be a succession of bipolar-IGFET modules; although, of course, it is only a single high-power module. An important feature of the invention is that a channel region 33 is included on both sides of each emitter region 34. Thus, both edges $E_1$ and $E_2$ of each emitter region 34 is adjacent to channel 33 and emitter current from these regions is therefore efficiently modulated by IGFET channel current.

While only three iterations of the repetitive structure have been shown, it can be appreciated that the entire device may be much longer than that shown. It can also be appreciated that the circuit module of the type shown in FIG. 4 of a given length has a much higher power handling capability than that of a module of the type shown in FIG. 3 of the same length; essentially, this is because the channel length of the FIG. 4 module is much greater than that of the FIG. 3 version. For the reasons given before, the high efficiency obtained by the invention is particularly desirable in a device having high power capabilities. It can also be appreciated that the structures shown can conveniently be fabricated by conventional integrated circuit techniques and can conveniently be connected to their external circuitry. Emitter regions 34 may be part of a single diffused region, as may be desirable for more convenient processing.

It is to be understood that the semiconductor portion described herein as a "wafer" may actually be an epitaxial layer grown on a semiconductor substrate.

As a typical example, the N-type wafer, or alternatively, epitaxial layer, may be silicon having a doping level of $5 \times 10^{14}$ to $10^{15}$ carriers/cm$^3$. The P-type regions may be diffused to a depth of about 2 microns, with a doping level of $5 \times 10^{18}$ carriers/cm$^3$ (200 ohms per square). The N+ emitter stripes and the collector stripe may have a depth of 1.6 microns and a doping level of $10^{20}$ carriers/cm$^3$ (5–10 ohms/square). The IGFET channel length may be 0.25 mil. Of course, different dimensions and conductivities and opposite or complementary conductivity types could be used.

It is to be understood that the embodiment shown is intended merely to illustrate the inventive concept involved. Various other embodiments and modifications may be made by those skilled in the art without departing from the spirit and scope of the invention.

What is claimed is:

1. A circuit module comprising:

a field effect transistor comprising interdigitated source and drain regions separated by a serpentine channel region;

the channel region being of a different conductivity type from that of the source and drain regions;

the drain region comprising a plurality of protrusions interleaved with protrusions of the source region;

a plurality of bipolar transistor portions each comprising an emitter region;

each emitter region being located on a different one of said drain region protrusions and being of a different conductivity type from that of the corresponding drain region protrusion.

2. The circuit module of claim 1 wherein:

each drain region protrusion and each corresponding elongated emitter region has a long dimension that extends in a common direction.

3. The circuit module of claim 2 wherein:

the field effect transistor and the bipolar transistor portions are formed on a common semiconductor wafer of a first conductivity type;

the field effect transistor source and drain regions are of a second conductivity type opposite that of the first conductivity type;

the drain region of the field effect transistor constitutes a base region for the bipolar transistor portion;

the emitter regions are of the first conductivity type; and the semiconductor wafer of the first conductivity type constitutes the collector of the bipolar transistor portions.

4. The circuit module of claim 3 wherein:

all of the emitter regions are connected via metal contacts to a common emitter terminal.

5. The circuit module of claim 4 further comprising:

a gate contact overlying the channel region and connecting to a single gate terminal;

a source contact in contact with the source region and connected to a single source terminal;

a collector contact connected to the wafer and to a single collector terminal.

6. The circuit module of claim 5 wherein:

the gate contact is insulated from the channel region.

* * * * *